United States Patent
Chang et al.

(10) Patent No.: US 9,439,280 B2
(45) Date of Patent: Sep. 6, 2016

(54) LED MODULE WITH CIRCUIT BOARD HAVING A PLURALITY OF RECESSES FOR PREVENTING TOTAL INTERNAL REFLECTION

(71) Applicant: ADVANCED OPTOELECTRONIC TECHNOLOGY, INC., Hsinchu Hsien (TW)

(72) Inventors: Chung-Min Chang, Hsinchu (TW); Chien-Lin Chang-Chien, Hsinchu (TW); Ya-Ting Wu, Hsinchu (TW); Zheng-Hua Yang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 7 days.

(21) Appl. No.: 14/474,797

(22) Filed: Sep. 2, 2014

(65) Prior Publication Data
US 2015/0062930 A1 Mar. 5, 2015

(30) Foreign Application Priority Data
Sep. 4, 2013 (CN) .......................... 2013 1 0394791

(51) Int. Cl.
| | | |
|---|---|---|
| H01L 21/00 | (2006.01) | |
| H05K 1/02 | (2006.01) | |
| H01L 25/075 | (2006.01) | |
| H01L 33/60 | (2010.01) | |
| H05K 3/28 | (2006.01) | |

(52) U.S. Cl.
CPC ......... *H05K 1/0274* (2013.01); *H01L 25/0753* (2013.01); *H01L 33/60* (2013.01); *H01L 2924/0002* (2013.01); *H05K 3/284* (2013.01); *H05K 2201/09036* (2013.01); *H05K 2201/10106* (2013.01); *H05K 2201/2054* (2013.01)

(58) Field of Classification Search
CPC ............... H05K 3/284; H05K 1/0274; H05K 2201/03096; H05K 2201/10106; H05K 2201/2054; H01L 25/0753; H01L 33/50
See application file for complete search history.

(56) References Cited

U.S. PATENT DOCUMENTS

| | | | | |
|---|---|---|---|---|
| 5,660,461 A | * | 8/1997 | Ignatius ................ | F21V 29/004 257/668 |
| 6,874,910 B2 | * | 4/2005 | Sugimoto ........... | H01L 25/0753 257/98 |
| 2008/0062701 A1 | * | 3/2008 | Harrah ................. | G02B 6/0021 362/296.07 |
| 2010/0124064 A1 | * | 5/2010 | Ogawa ...................... | F21K 9/00 362/307 |
| 2012/0106171 A1 | * | 5/2012 | Wang .................... | H01L 33/486 362/362 |

(Continued)

FOREIGN PATENT DOCUMENTS

| TW | 200814365 A | 3/2008 |
|---|---|---|
| TW | M401207 U1 | 4/2011 |
| TW | M422764 U1 | 2/2012 |

OTHER PUBLICATIONS

Way-Jze Et Al., Taiwan Patent Application 200814365, Mar. 2008, machine translation.*

(Continued)

*Primary Examiner* — Tracie Y Green
(74) *Attorney, Agent, or Firm* — Zhigang Ma

(57) ABSTRACT

An light emitting diode (LED) module includes a circuit board, a plurality of LED chips arranged on and electrically connected to the circuit board, and an encapsulant arranged on the circuit board and covering the LED chips, a plurality of first recesses defined in a first surface of the circuit board.

16 Claims, 3 Drawing Sheets

(56) References Cited

U.S. PATENT DOCUMENTS

| | | | | |
|---|---|---|---|---|
| 2012/0302124 | A1* | 11/2012 | Imazu | H01L 33/486 445/58 |
| 2013/0056776 | A1* | 3/2013 | Su | H01L 33/60 257/98 |
| 2015/0243862 | A1* | 8/2015 | Sheng | H01L 33/10 257/88 |

OTHER PUBLICATIONS

Chen, Jionf-Xun, Taiwon Patent Application M422164, Oct. 2011, machine translation.*

* cited by examiner

LED MODULE WITH CIRCUIT BOARD HAVING A PLURALITY OF RECESSES FOR PREVENTING TOTAL INTERNAL REFLECTION

CROSS-REFERENCE TO RELATED APPLICATIONS

This application claims priority to Chinese Patent Application No. 201310394791.6 filed on Sep. 4, 2013, the contents of which are incorporated by reference herein.

FIELD

The disclosure relates to an light emitting diode (LED) module, and particularly to an integrated LED module.

BACKGROUND

Total reflection happens in the LED module, which decreases a light-extraction efficiency of the LED module.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 1:
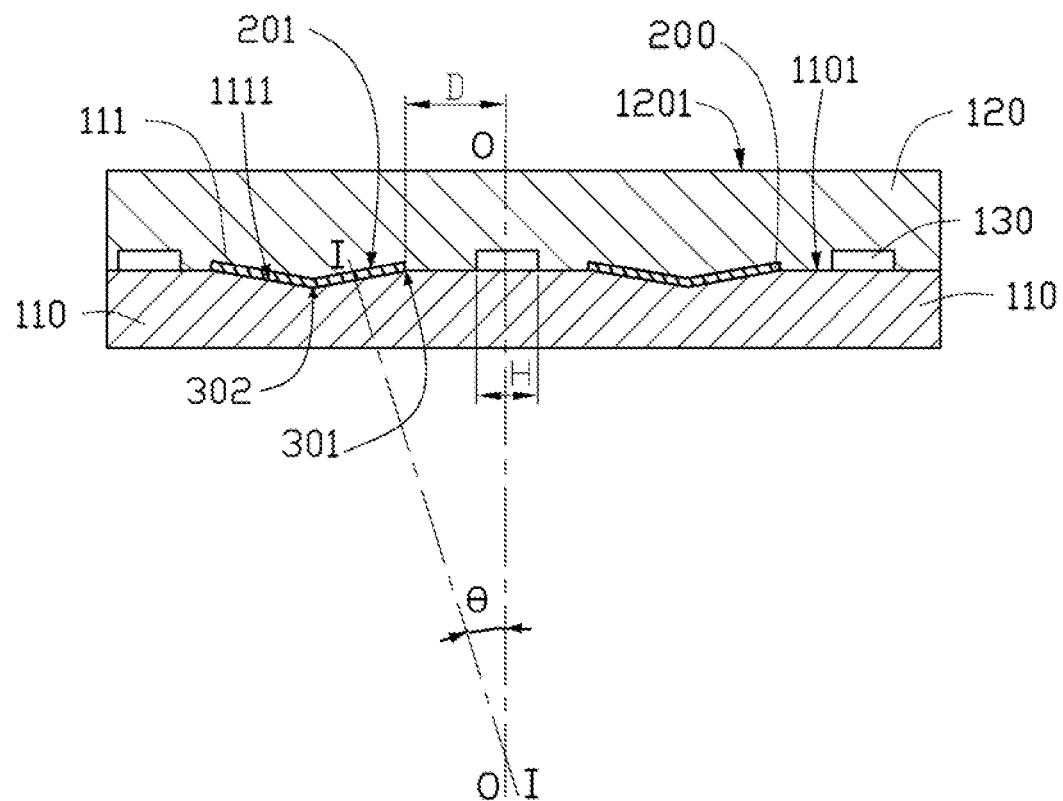
FIG. 1 is a cross-sectional view of an LED module in accordance with a first exemplary embodiment of the present disclosure.

Referring to FIG. 1, an LED (light emitting diode) module 10 includes a circuit board 110, a plurality of LED chips 130 and an encapsulant 120. The circuit board 110 can be a circuit printed board, a ceramic base circuit board, a metal base circuit board, a fiber-glass circuit board, a multilayer circuit board or a flexible circuit board et al. The metal base circuit board can be an aluminum base circuit board or a copper base circuit board et al. The LED chips 130 are arranged on and electrically connected to the circuit board 110. The LED chips 130 can be electrically connected to the circuit board 110 by flip-chip or wire bonding. The encapsulant 120 is formed on the circuit board 110 and covers the LED chips 120.

A plurality of first recesses 111 are defined in the circuit board 110. The first recesses 111 can be defined in a first surface 1101 of the circuit board 110. The first recesses 111 are defined between the LED chips 130. A pair of inclined surfaces 1111 is defined in each first recess 111. A first edge 301 and a second edge 302 are defined in each inclined surface 1111. Each inclined surface 1111 intersects on the first surface 1101 at the first edge 301. The two inclined surfaces 1111 of each first recess 111 intersect at the second edge 302. A distance between each first edge 301 and a second surface 1201 of the encapsulant 120 is less than that between the second edge 302 and the second surface 1201. The second surface 1201 is a top surface of the encapsulant 120 and does not touch the circuit board 110. A distance D between the first edge 301 and an optic axis O-O of a neighboring LED chip 130 is larger than or equal to a half of a width H of the LED chip 130, such that D≥½·H. In at least one embodiment, a cross section of each first recess 111 is V-shaped.

A plurality of refractive parts 200 are arranged on the first recesses 111. The refractive parts 200 can be metal. The refractive parts 200 can be made of aluminum (Al) or silver (Ag), etc. A pair of refractive surfaces 201 are defined in each refractive part 200. Each refractive surface 201 is parallel to a corresponding inclined surface 1111. An angle θ between a normal line I-I of each refractive surface 201 and the optic axis O-O of the neighboring LED chip 130 is less than 90°, such that θ<90°.

Figure 2:
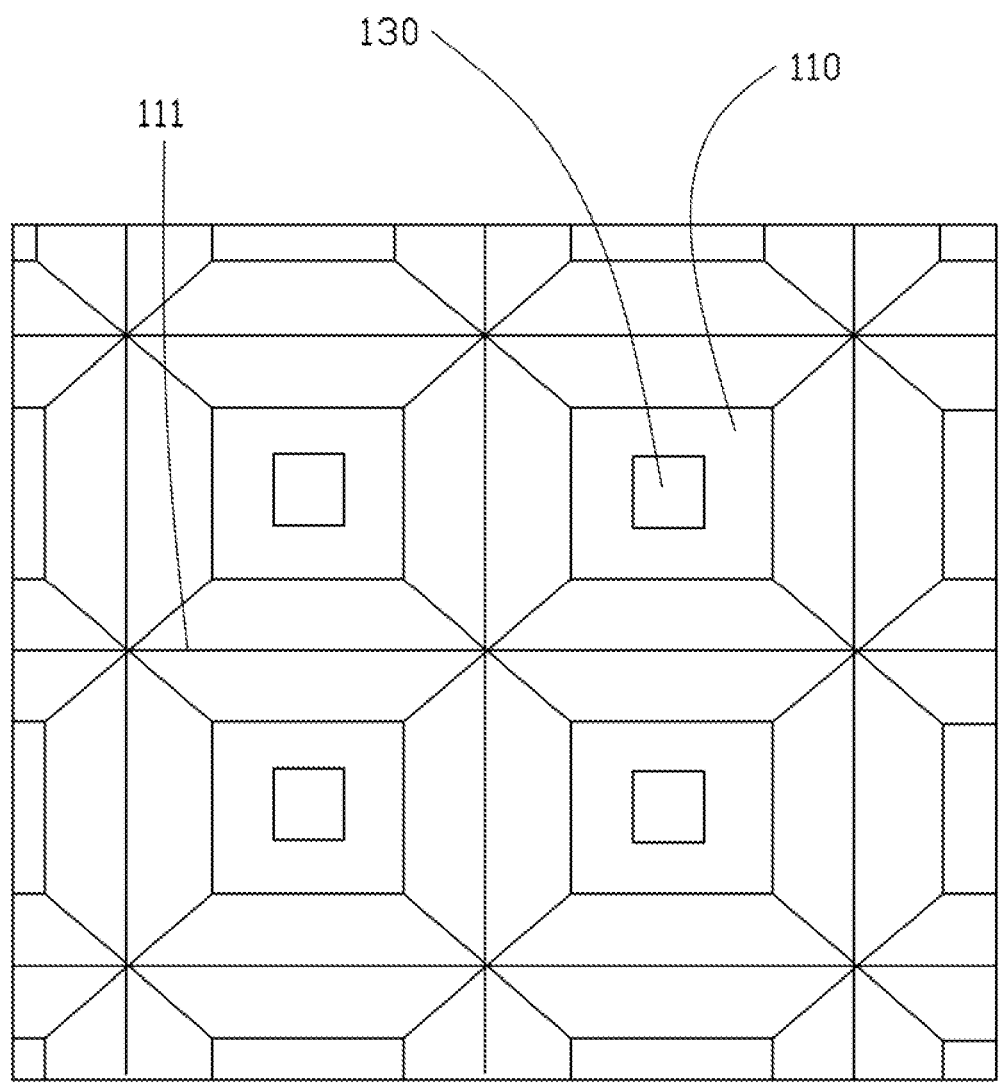
FIG. 2 is a top plan view of a circuit board with LED chips of an LED module in accordance with a second exemplary embodiment of the present disclosure.

In at least one embodiment, referring to FIG. 2, each first recess 111 is defined between two adjacent LED chips. A top view of the first recesses can be crisscross-shaped. The top view of the first recesses 111 can be a net.

Figure 3:
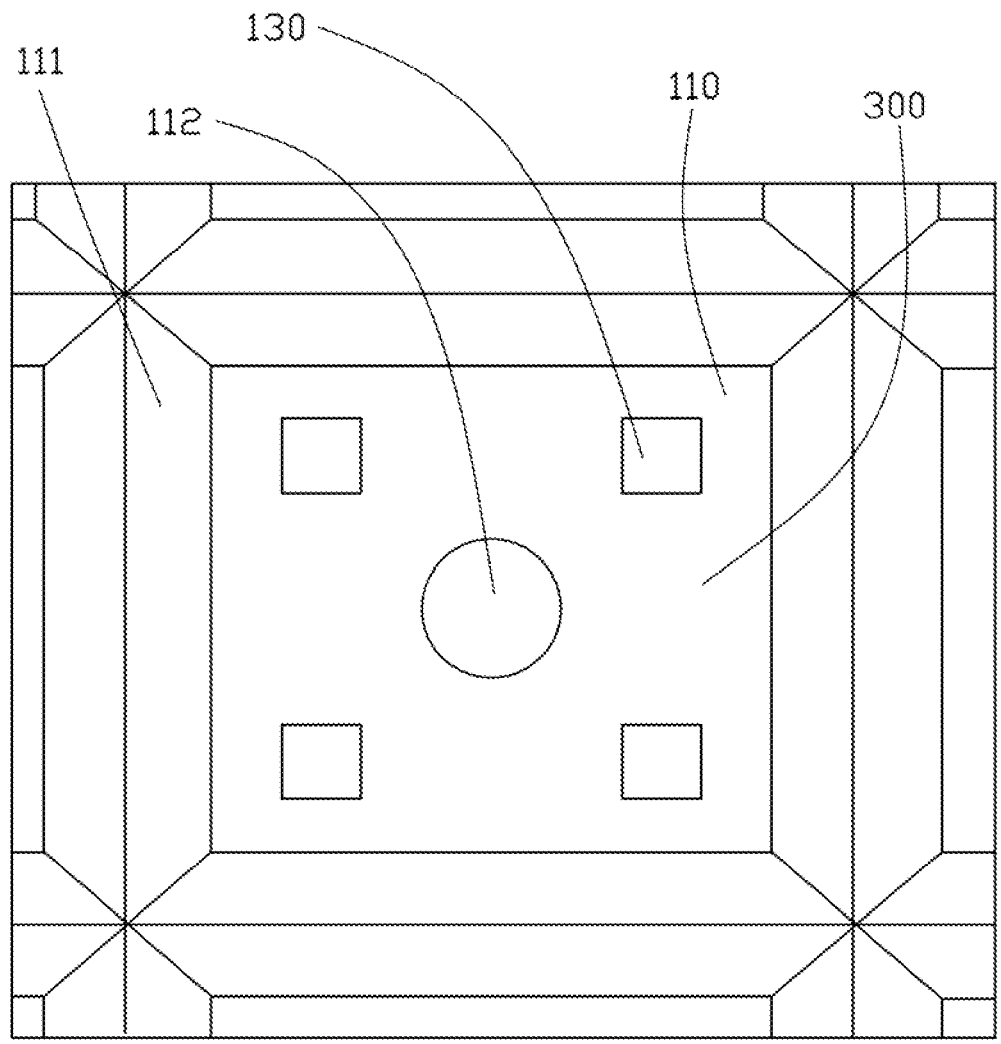
FIG. 3 is a top plan view of a circuit board with LED chips of an LED module in accordance with a third exemplary embodiment of the present disclosure.

In at least one embodiment, referring to FIG. 3, each first recess 111 is defined between LED chips. The top view of the first recesses can be crisscross-shaped. The top view of the first recesses 111 can be a net. A plurality of second recesses 112 can be defined in gaps 300 between the first recesses 111. The second recesses 112 can be defined between the LED chips 120. Each second recess 112 can be a conical recess or a truncated conical recess et al.

The encapsulant 120 can include a plurality of photo luminescence properties (not shown). The photoluminescence properties can be phosphor powder or fluorescent powder et al. A refractive index of the encapsulant 120 can be in a range from 1.4 to 1.5. In at least one embodiment, the refractive index of the encapsulant 120 can be 1.4. In at least one embodiment, the refractive index of the encapsulant 120 can be 1.5.

It is to be further understood that even though numerous characteristics and advantages have been set forth in the foregoing description of embodiments, together with details of the structures and functions of the embodiments, the disclosure is illustrative only; and that changes may be made in the details, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED module. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An LED (light emitting diode) module comprising:
a circuit board;
a plurality of LED chips arranged on and electrically connected to the circuit board; and
an encapsulant arranged on the circuit board and covering the LED chips, a plurality of first recesses defined in a first surface of the circuit board;
wherein the first recesses each have a pair of inclined surfaces, the first recesses form a net, the LED chip is mounted in the net and surrounded by the first recesses alternated with each other, and a plurality of refractive parts are arranged on the first recesses.

2. The LED module of claim 1, wherein the first recesses are defined between the LED chips.

3. The LED module of claim 2, wherein each first recess is defined between two adjacent LED chips.

4. The LED module of claim 1, wherein a first edge and a second edge are defined in each inclined surface, a distance between the first edge and a second surface of the encapsulant is less than that between the second edge and the second surface of the encapsulant, the second surface is a top surface of the encapsulant and does not touch the circuit board.

5. The LED module of claim 4, wherein a cross section of each first recess is V-shaped.

6. The LED module of claim 4, wherein each inclined surface intersects on the first surface of the circuit board at the first edge.

7. The LED module of claim 6, wherein the two inclined surfaces of each first recess intersect at the second edge.

8. The LED module of claim 7, wherein a distance between the first edge and an optic axis of a neighboring LED chip is larger than or equal to a half of a width of the LED chip horizontal to the circuit board.

9. The LED module of claim 8, where in an angle between a normal line of each inclined surface and the optic axis of the neighboring LED chip is less than 90°.

10. The LED module of claim 1, wherein a pair of refractive surfaces are defined in each refractive part.

11. The LED module of claim 10, wherein an angle between a normal line of each refractive surface and an optic axis of the neighboring LED chip is less than 90°.

12. The LED module of claim 1, wherein a plurality of second recesses are defined in gaps of the first recesses.

13. The LED module of claim 12, wherein the second recesses are defined between the LED chips.

14. The LED module of claim 13, each second recess is a conical recess or a truncated conical recess.

15. The LED module of claim 1, wherein the encapsulant comprises a plurality of photoluminescence properties.

16. The LED module of claim 15, wherein a refractive index of the encapsulant is in a range from 1.4 to 1.5.

* * * * *